United States Patent
Xia et al.

(10) Patent No.: US 7,067,015 B2
(45) Date of Patent: Jun. 27, 2006

(54) MODIFIED CLEAN CHEMISTRY AND MEGASONIC NOZZLE FOR REMOVING BACKSIDE CMP SLURRIES

(75) Inventors: Changfeng Xia, Plano, TX (US); Linlin Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 377 days.

(21) Appl. No.: 10/284,708

(22) Filed: Oct. 31, 2002

(65) Prior Publication Data

US 2004/0084059 A1 May 6, 2004

(51) Int. Cl.
*C23G 1/02* (2006.01)

(52) U.S. Cl. .................. 134/3; 134/1; 134/3; 134/6; 134/26; 134/28; 134/34; 216/108; 216/109; 438/690; 438/745; 438/906; 510/175

(58) Field of Classification Search .............. 134/1, 134/3, 6, 26, 28, 34, 2; 216/108, 109; 438/690, 438/745, 906; 510/175
See application file for complete search history.

(56) References Cited

U.S. PATENT DOCUMENTS

| 3,240,987 | A | * | 3/1966 | Hicks, Jr. ............... 315/8.61 |
|---|---|---|---|---|
| 4,294,651 | A | * | 10/1981 | Ohmura ................... 438/750 |
| 4,588,473 | A | * | 5/1986 | Hisatomi et al. ........... 438/460 |
| 4,649,227 | A | * | 3/1987 | Tributsch et al. .......... 136/252 |
| 5,013,681 | A | * | 5/1991 | Godbey et al. ............ 438/459 |
| 5,462,898 | A | * | 10/1995 | Chen et al. ............... 438/788 |
| 6,048,789 | A | * | 4/2000 | Vines et al. ............... 438/633 |
| 6,230,720 | B1 | * | 5/2001 | Yalamanchili et al. ....... 134/1.3 |
| 6,645,855 | B1 | * | 11/2003 | Hoepfner .................. 438/666 |
| 2003/0230548 | A1 | * | 12/2003 | Sievert et al. ............... 216/2 |

FOREIGN PATENT DOCUMENTS

| JP | 58-40829 | * | 3/1983 |
|---|---|---|---|
| JP | 2000-124093 | * | 4/2000 |

OTHER PUBLICATIONS

W.Kern. Handbook of Semiconductor Wafer Cleaning Technology. Noyes Publications, 1993. pp. 136–142,144.*

* cited by examiner

*Primary Examiner*—M. Kornakov
(74) *Attorney, Agent, or Firm*—Peter K. McLarty; W. James Brady, III; Frederick J. Telecky, Jr.

(57) ABSTRACT

A cleaning chemistry for lowering defect levels on the backside of a semiconductor wafer after chemical mechanical planarization (CMP). In a preferred embodiment of the present invention, a cleaning chemistry comprising nitric acid, hydrofluoric acid, and phosphoric acid in solution with deionized water is applied to the wafer surface to be cleaned preferably while subjected to megasonic assist cleaning. The wafer is preferably then subjected to brush scrubbing and a deionized water rinse with megasonic assist cleaning.

17 Claims, 3 Drawing Sheets

MODIFIED CLEAN CHEMISTRY AND MEGASONIC NOZZLE FOR REMOVING BACKSIDE CMP SLURRIES

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD OF THE INVENTION

The present invention relates generally to a method for reducing particulate defects on the surface of semiconductor wafers during the fabrication process. In particular, the invention relates to a method for particle reduction following the chemical mechanical polishing or planarization (CMP) during wafer fabrication. More specifically, the invention relates to a method for removing particles from wafer backsides using an acid-based chemistry, and optionally, a megasonic cleaning operation.

BACKGROUND OF THE INVENTION

Modern-day semiconductor devices, commonly called microchips or integrated circuits, are fabricated in nearly particle-free "cleanroom" or "wafer fab" environments using a multi-step process that constructs numerous integrated circuits in the form of chips, or "die," on disc-shaped wafers. Due to the miniscule scale of circuitry on each integrated circuit, it is critical to the fabrication process that the wafers remain as clean and particle-free as possible, as even tiny particles may lead to defects that render a device inoperable, consequently lowering yield and associated profits. Raising the number of good die per wafer is critical to improving fabrication throughput, or the total functional product produced during a certain time period.

With the advent of more advanced technologies, the semiconductor industry is moving in the direction of larger-diameter wafers and smaller die. Consequently, more integrated circuits can be "squeezed" onto a single wafer, contributing to higher throughput. If the defect total for a given wafer area were assumed constant, a smaller die would then encompass fewer defects. However, as smaller circuitry is used within a die, and as the sheer amount of circuitry within each die is concurrently increased, a small defect can be more problematic, as it can contact greater active areas on the die.

In addition, with advancing technology, the number of metal layers within a die is increasing. Polishing and subsequent particle-removal operations are generally associated with each metal layer, so the repetitions of cleaning operations will increase with the number of layers. As defects not removed from one layer can cause problems on subsequent layers, the importance of effectively removing particulate matter from a wafer is increasing. Therefore, more effective and efficient methods are sought for reducing particulate contamination of the wafers during the fabrication process.

Since the late 1950s, integrated circuit technology has evolved rapidly and has revolutionized virtually every industry and capacity in which integrated circuits are used. Today's integrated circuits frequently employ hundreds of thousands or even millions of transistors and highly complex, multi-layered designs. The proliferation of electronics in general, and integrated circuits in particular, has resulted in large part from the ability to increase circuit functionality while simultaneously reducing device cost and size. An important catalyst for these improvements has been advances in semiconductor processing technologies, the various techniques used to construct circuit elements—e.g., transistors, resistors and capacitors—on the semiconductor substrate, as well as the necessary conducting interconnects between individual circuit elements. Improved materials, equipment and processes have allowed increasingly complex circuits with improved speed, reduced power requirements and smaller footprints.

Integrated circuits are typically constructed at the surface of a silicon wafer sliced from a single-crystal ingot, although other semiconductors such as gallium arsenide and germanium are also used. Individual circuit elements are fabricated on the wafer surface. The electrical conduction between appropriate circuit elements, and electrical isolation between other circuit elements, is then established using alternating layers of appropriately patterned conductors and insulators. The circuit elements and their interconnections are formed using a series of processing steps including ion implantation, thin film deposition, photolithography, and selective etching, as well as various cleaning processes.

Each new technology generation brings both increased functionality and an increased number of active metal layers on each die. Integrated circuits are fabricated in layers using several complex operations, with many processes repeated as each layer is created. In a simplified account, after diffusion and deposition steps, metal layers are sputtered onto the wafer. These layers are subsequently subjected to chemical mechanical planarization (CMP), for better planarity to reduce light scattering and for the specific height to ensure proper depth of focus in subsequent photolithography operations.

Photolithography involves spinning a light-sensitive photoresist material onto the wafer surface. Next, using precise optical processes, individual integrated circuits are formed by using a stepper or scanner tool to repetitively expose a pattern on a glass mask, or reticle, in a grid-like fashion onto the photoresist material. If the wafer surface to be exposed is not precisely at the correct distance from the stepper or scanner lens, the exposed image may be out of focus, improperly sized, or otherwise distorted. Such defects can lead to critical dimension losses, as the feature dimensions of an ideally flat wafer are associated with a relatively large geometric tolerance compared to those of a tilted wafer. As die sizes continue to shrink, device features and their associated tolerances will be concurrently smaller, thereby raising the importance of wafer flatness.

After exposure, the exposed photoresist material is normally cured, then developed, typically dissolving exposed areas of the photoresist and leaving the wafer ready for etching or implant doping. The aforementioned processes are generally repeated as each metal layer is fabricated, with some advanced microprocessors requiring seven or more metal layers. Improper exposure due to nonplanarity may also contribute to "hotspots," defective wafer areas which may include missing or malformed vias, the electrical channels which pass through insulating dielectric layers and connect active metal on one layer to metal on an adjacent layer. Reducing hotspots and other wafer defects contributes to increased tool availability, yield improvements and cost reductions.

As the number of layers fabricated on a wafer increase, planarity and cleanliness of the wafer surface become more important, as minute features created on the wafer surface must line up with corresponding features on the layer below. Such features are often only a fraction of a micron wide (where a micron is one millionth of a meter) so it is critical that the wafer surface be substantially free of topological defects, as with every subsequent layer, any topological defect becomes magnified. Surface non-planarity or particulate matter on the wafer surface can lead to feature registration issues, when the components on adjacent layers do not "line up" properly, potentially leading to nonfunctional or faulty integrated circuits.

A primary challenge in wafer fabrication is the continuing reduction of defect levels. Defects or particles potentially present on wafer surfaces include CMP slurry residue, oxides, organic contaminants, mobile ions and metallic impurities. Generally, a "killer defect" (particle) is less than half the size of the device linewidth. For instance, a device using 0.18-micron ($\mu$m) linewidth geometry will require that the wafer be substantially free of particles smaller than 0.09 $\mu$m, and at 0.13 $\mu$m geometry, particles smaller than 0.065 $\mu$m. Due to their smaller size, it is physically more difficult to remove smaller particles than larger particles, so it is beneficial to prevent deposition of particles onto the wafers as much as possible and to develop more effective, comprehensive wafer cleaning methods.

Increasingly complex integrated circuits utilize an growing number of circuit elements, which in turn requires both more electrical conduction paths between circuit elements and a greater number of conductor-insulator layers to achieve these paths. This has proved problematic for several reasons. First, longer interconnect paths means increasing resistance and capacitance, which not only decreases circuit speed by increasing RC-delay times but also increases resistive power loss. Second, an increasing number of layers makes successive layer-to-layer alignment, or registration, more difficult. Layers that lack global and local planarity further compound the registration problem. Historically, the techniques available to improve layer planarity in the semiconductor industry have been quite limited.

Until recently, aluminum was the interconnect conductor of choice in integrated circuit fabrication. Techniques for depositing thin aluminum films are well established and, because aluminum trichloride is somewhat volatile, aluminum can be etched effectively in chlorine plasmas to form patterned aluminum films following appropriate photolithography steps. At the same time, aluminum interconnects have several undesirable properties. First, aluminum is not a particularly good conductor; its resistivity is considerably higher than some other metals. Second, aluminum is particularly susceptible to electromigration, the physical movement of a conductor due to electron flow. Electromigration at grain boundaries results in conductor discontinuities and reduced circuit reliability.

The semiconductor industry is transitioning from aluminum to copper as the electrical conductor of choice for establishing interconnections between circuit elements. Copper has a significantly higher conductivity than aluminum and is inherently more resistant to electromigration. Although these properties of copper have been known for a long time, the absence of acceptable methods for selectively etching or otherwise removing copper have limited its use. Unlike aluminum, copper is not amenable to plasma etch. Thus, a key limitation in moving to copper metallization is the ability to etch or otherwise remove copper at the wafer surface. Improved CMP technologies are facilitating the shift to copper metallization, as CMP not only provides a method for copper removal and for forming patterned copper films, but also addresses the increased need for local and global planarity in complex integrated circuit architectures.

Today, CMP is an essential step in the manufacture of almost every modern integrated circuit. A typical logic device may include upwards of seven inner-layer dielectric (ILD) CMP steps, seven metal CMP steps and one shallow trench isolation (STI) CMP step. Put simply, CMP is quickly becoming a central aspect of semiconductor processing in the formation of integrated circuits.

The CMP operation generally serves to remove excess coating material, reduce wafer topographical imperfections, and improve the depth of focus for photolithography processes through better planarity. The CMP process involves the controlled removal of material on the wafer surface through the combined chemical and mechanical action on the semiconductor wafer of a slurry of abrasive particles and a preferably polyurethane polishing pad embedded with abrasive material. During the CMP operation, sub-micron-size particles from an associated polishing slurry are used to remove non-planar topographical features and extra coating on the wafer surface. After the CMP operation, these ultra-small slurry particles, typically silica ($SiO_2$) or alumina ($Al_2O_3$) and residual particles from the polishing pad, as well as metals from the polished wafer may remain on the wafer surface and can be problematic.

The slurries used in CMP are best classified by the types of films they are intended to planarize. In semiconductor manufacturing, CMP processes are most commonly used for films comprised of silicon oxide, tungsten, copper, tantalum and titanium. CMP of copper films, for example, often employs slurries based on ammonia, which offers high copper ion solubility through ion complexation.

In addition to polishing of metallization layers, CMP processing generally also involves barrier layer and dielectric layer polishing. A barrier layer is a layer disposed between two layers that prevent one layer from contaminating the other layer and vice versa. The dielectric layer is frequently comprised of an oxide material such as silica that forms the electrically insulating layer between conducting metal layers. Copper metallization schemes often employ barrier metals such as tantalum or tantalum-rich alloys between the copper and dielectric layers to minimize cross-contamination between those layers. A integrated CMP processing technique should allow the polishing and planarization of alternating layers such as those described— e.g., a layer comprising copper on a layer comprising tantalum on a layer comprising oxide.

Following the CMP process, wafers are typically subjected to a post-CMP cleaning process to remove particulate and molecular contaminants before continuing the construction of the integrated circuit. For wafers processed in batches, rather than individually, storage techniques are used following the CMP process and prior to the post-CMP cleaning process. Storing the wafers frequently consists of placing them in a cassette filled with an appropriate liquid such as water.

For a variety of reasons, currently available post-CMP wafer backside clean techniques are less than optimal. First, the CMP process involves the use of small, abrasive particles that can prove difficult to remove from the wafer surface. Although the slurry particles serve a valuable role during CMP, they constitute particulate defects following the CMP process. Consequently, techniques for improving the removal efficiency of slurry particles are desirable. In addition, molecular contaminants can be introduced during the CMP process that are not always effectively removed during post-CMP cleaning.

As the CMP process is now widely used to provide global planarity of layers during wafer fabrication, successful yield management of CMP requires detection of critical defects such as non-uniform film thickness or process variations within a wafer lot. Defect levels on semiconductor wafers are closely monitored after several operations in the wafer fabrication process. One effective and quick way of measuring defect levels is to subject a wafer to a surface scanning process, which detects surface irregularities and particulate contamination with beams of laser light. CMP defects can generally be separated into two categories: residual slurry particles, metals or other foreign material on the wafer surface, and scratches, grooves or pits in the wafer surface itself. Both defect types are known to have a negative impact on device yield. As is it often difficult to remove minute particles from the surfaces of wafers, new methods for reducing particulate contamination are always being sought. Not only can particles cause killer defects by their very presence, they may also contribute to wafer surface damage, such as the aforementioned scratches, during subsequent post-CMP cleaning operations.

After metal- or dielectric-layer CMP, particle counts on wafer backsides are typically very high. Previously, no process has been dedicated strictly for removal of wafer backside particles. Particles present on wafer backsides are primarily composed of CMP slurry, ranging from smaller than 0.1 micron to 1.0 micron and larger, although with the advent of copper interconnect technology, copper metal residue is also becoming problematic. When particulate matter is present on a wafer backside during photolithography, the wafer may be slightly inclined from horizontal. It then becomes extremely difficult to achieve the precise surface flatness and parallelism required for proper depth of focus for pattern exposure.

Slurry residue on a wafer backside can cause problems beyond an individual wafer. In wafer fabrication, process equipment entities, or tools, are generally cleaned on a regular basis to ensure a virtually particle-free processing environment. During processing, wafers may be removed from a process chamber by a robot arm, which would typically pick up a subsequent wafer and place it into the chamber. If slurry, metal particles or other residue is present on a wafer backside, particulate matter can be spread from one wafer to the next by a robot arm. In this case, the robot arm could potentially contaminate several subsequently handled wafers. Additionally, if several subsequent wafers are also initially contaminated, particulate matter could accumulate on the robot arm, leading to contamination buildup.

In several processing tools, wafers are placed on "chucks," generally flat surfaces that could collect particulate matter from a contaminated wafer and spread particles to the backside of a subsequent wafer. Contaminated wafers then moving to a subsequent process tool could spread particles to a sequence of tools, contributing to processing defects in a number of fabrication operations. High-pressure deionized (DI) water sprays can also cause migration of particles from a contaminated wafer backside and reposition onto the wafer front. Additionally, wafers placed adjacent to one another in baths or other holding items such as cassettes may cross-contaminate one another. Preventing contamination caused by the inadvertent deposition of copper on wafer backsides poses a more daunting challenge. This problem has been addressed in part by more stringent requirements imposed on processing equipment and more demanding protocols imposed on manufacturing practices.

Copper contamination is especially troublesome in a fabrication environment, as copper particles can migrate to electrical components on the wafer front, contributing to shorts, leaks and other electrical failures. Copper contamination can arise from tools and equipment involved in the deposition and handling of wafers. For example, a deposition tool that coats wafers with copper films may deposit copper on the beveled edge of the wafer. This wafer may then be sent to a metrology tool equipped with a wafer handler that manipulates the edges of wafers processed in various areas of the fab. This wafer handler, contaminated with copper, may then cross-contaminate wafers that are destined for an etch tool. The etcher eventually becomes contaminated with copper, and the copper contamination spreads through the fab, potentially accumulating in plasma process chambers, wet benches, and lithography steppers.

Wafer handling is the most likely source of copper cross-contamination, since it is the most universal mechanism in a fab. This includes not only automation equipment, such as robots, but also plastic wafer carriers, or cassettes. If copper is left on the wafer bevel as it exits a process tool, the carrier will likely be contaminated with copper. Great care must be taken either to limit the use of wafer carriers to a specified area or to switch to clean carriers once the copper is removed from the bevel. The management of this task can be logistically complex, because most semiconductor equipment is designed for cassette-to-cassette automation —that is, one carrier handles both incoming and outgoing wafers. Cross-contamination, or the spread of particulate matter between wafers and tools or adjacent wafers, is a fabrication issue that can be at least partly addressed by developing improved wafer cleaning methods.

Several prior art methods for post-CMP cleaning exist, two of most common being brush scrubbing and megasonic-assist cleaning. Brush scrubbing is a mechanical contact, single-wafer cleaning process, wherein wafers are passed in succession through a cleaning chamber, where they are contacted with rotating brushes that deliver DI water and cleaning chemicals to the wafer. As conventional brush scrubbing typically only addresses the front side of a wafer, this method is not sufficient to clean particles from wafer backsides. Megasonic-assist cleaning is a wafer cleaning process that can be used in combination with brush scrubbing or other cleaning methods. During megasonic cleaning, a megasonic transducer delivers sonic energy to a wafer through a cleaning medium, generally DI water or a cleaning liquid.

Megasonic-assist cleaning generally loosens particles on a wafer surface being rinsed by DI water or a cleaning medium. The energized wafer surface loosens particles and prevents reattachment of particles. Typically, after the initial rinse, the wafer is subjected to a high-pressure water spray to remove any loosened particles. The wafer may then be passed under and scrubbed by a rotating foam brush to loosen remaining particles, then subjected to another rinse to remove remaining particles.

Currently, after undergoing CMP, wafers are typically subjected to either a single-wafer clean process or a batch clean process. In a typical single-wafer cleaning process, a single wafer may be spun while different cleaning solutions are applied to the wafer surface to be cleaned. In a conventional batch clean process, a batch of wafers is immersed into a plurality of tanks containing various cleaning solutions. Common cleaning methods generally address either metal contamination, or non-metal contamination. In addition, conventional post-CMP cleans are often focused on the wafer front, with little or no attention to specifically removing particulate matter from wafer backsides.

After performing a baseline, or standard, CMP operation, wafers subjected to a conventional batch-clean process wherein wafers are showed higher-than-acceptable defect levels on their backsides during surface-scanning defect detection. When subjected to a conventional post-CMP single-wafer clean process involving dispensing a cleaning medium onto a spinning wafer, wafer backsides showed about a fifty-percent reduction in particles, however, defect levels were still higher than desired. These conventional wafer-cleaning methods suffer from two shortcomings. First, conventional post-CMP cleaning processes are not specifically intended for cleaning the wafer backsides. Second, they are relatively ineffective in removing metal contamination, as conventional cleans are primarily designed to remove non-metallic slurry residue.

Special care is taken in a wafer fabrication environment to prevent the spread of metal particles from one process tool to another. Current methods for removing copper contaminants from wafers utilize nitric ($HNO_3$) acid, which at least partially dissolves copper particles, depending on their size. However, nitric acid is an oxidizing acid that will not remove slurry particles, which consist primarily of silica or alumina, metals that have already oxidized.

Wafer backside defects can account for a significant percentage of yield loss in a wafer fab, causing millions of dollars in lost revenue annually. Backside defects can have a significant impact on wafer and process uniformity, both of which are critical issues in advanced 300-mm wafer processing. The backsides of production wafers may become contaminated or damaged at nearly every process step, including deposition, etch, and chemical mechanical planarization (CMP). The move to double-sided polish wafers for advanced 300-mm semiconductor applications is also creating a challenge, since defects previously hidden in the wafer topography on the backside surface of single-sided polish wafers are brought to the surface when the backside is polished. These defects distort the front surface of wafers during subsequent photolithography exposure, causing yield-destroying "hotspots" of out-of-focus photolithography patterns. Backside defects can also migrate between processes, creating gate dielectric and other failures.

The shortcomings of conventional post-CMP cleaning methods become apparent during post-CMP defect detection, as defect levels are generally higher than desired. It is desired to implement a method for wafer cleaning that simultaneously and effectively removes both metal and non-metal particles from wafer backsides.

BRIEF SUMMARY OF THE PREFERRED EMBODIMENTS

The preferred embodiments of the present invention include improved methods and an aqueous cleaning solution for removing defects from a semiconductor wafer backside. The preferred embodiment may be especially beneficial in removing defects from wafers during a post-CMP cleaning process. One preferred embodiment of the present invention discloses a method for removing defects from a semiconductor wafer backside comprising the step of applying an aqueous cleaning solution comprising nitric acid ($HNO_3$) and hydrofluoric acid (HF) to the semiconductor wafer backside. Optionally, the method of preferred embodiment includes an aqueous cleaning solution further comprising an acid selected from the group consisting of phosphoric acid ($H_3PO_4$), acetic acid ($HC_2H_3O_2$) and combinations thereof.

Nitric acid acts to remove metal particles from a semiconductor wafer, while hydrofluoric acid acts to undercut slurry particles typically comprised of alumina or silica. Phosphoric acid may be included in an embodiment due to its effectiveness at attacking and removing alumina particles. Alternately, acetic acid may be used to vary the viscosity of the aqueous cleaning solution of the present invention, if so desired.

The aqueous cleaning solution of the preferred embodiments may be rinsed, spun, sprayed or otherwise applied to the back surface of a semiconductor wafer. At least a portion of the aqueous cleaning solution of the preferred embodiments may then be removed from the wafer by a rinsing liquid. Optionally, a mechanical brush scrub may be applied to the wafer backside to further remove particles, followed by a water rinse. Also optionally, megasonic energy may be applied either to the aqueous cleaning solution of the preferred embodiments upon application to the wafer backside, or to the rinsing liquid, or to both.

Notation and Nomenclature

Certain terms are used throughout the following description and claims to refer to particular system components. As one skilled in the art will appreciate, semiconductor companies may refer to processes, components, and subcomponents by different names. This document does not intend to distinguish between components that differ in name but not function. In the following discussion and in the claims, the terms "including" and "comprising" are used in an open-ended fashion, and thus should be interpreted to mean "including, but not limited to . . . "

The term "semiconductor device" refers generically to an integrated circuit, whether integral to a wafer, singulated from a wafer, or packaged for use on a circuit board. The term "integrated circuit" refers to a semiconductor device, fabricated upon a semiconductor substrate and having internal electrical circuit elements. The term "circuit element" refers to electrical components comprising an integrated circuit, including transistors, resistors and capacitors. The term "die" refers generically to one or more integrated circuits, in various stages of completion, whether integral to a wafer or singulated from the wafer. The term "wafer" refers to a generally round, single-crystal semiconductor substrate upon which integrated circuits are fabricated in the form of die. To the extent that any term is not specially defined in this specification, the intent is that the term is to be given its plain and ordinary meaning.

BRIEF DESCRIPTION OF THE DRAWINGS

For a more detailed description of the preferred embodiment of the present invention, reference will now be made to the accompanying drawings, wherein.

DETAILED DESCRIPTION OF PREFERRED EMBODIMENTS

The preferred embodiments of the present invention include a chemical composition effective at removing particles from the backsides of semiconductor wafers. Preferably, the chemical composition of the cleaning chemistry is an aqueous cleaning solution comprising nitric acid ($HNO_3$) and hydrofluoric acid (HF). Preferably, the solution further comprises phosphoric acid ($H_3PO_4$) and/or acetic acid ($HC_2H_3O_2$) Preferably, the aqueous cleaning solution comprises from about 1 to about 66 weight percent of nitric acid, from about 1 to about 46 weight percent of hydrofluoric acid, and from about 20 to about 98 weight percent of DI water. Still more preferably, the aqueous cleaning solution comprises from about 10 to about 40 weight percent of nitric acid, from about 2 to about 15 weight percent of hydrofluoric acid, and from about 25 to about 88 weight percent of DI water.

When present, phosphoric acid and/or acetic acid are preferably present at a concentration of about 1 to about 76 weight percent of the aqueous cleaning solution. More preferably, phosphoric acid and/or acetic acid are present at a concentration of about 5 to about 20 weight percent of the aqueous cleaning solution. Most preferably, the chemical cleaning solution comprises from about 27 to about 29 weight percent of nitric acid, from about 14 to about 16 weight percent of phosphoric acid and/or acetic acid, from about 5 to about 7 weight percent of hydrofluoric acid, and from about 50 to about 68 weight percent of DI water.

Although these acids are typically added as concentrated aqueous solutions, it will be understood that the weight percentage of acid refers to the weight percentage of pure acid present in the aqueous cleaning solution. Furthermore, as will be appreciated by one of ordinary skill in the art, other ranges of the chemical components may prove effective and are within the scope of the present invention. Consequently, the scope of the present invention is not intended to be limited by the preferred embodiments.

It is especially important to maintain low defect levels and achieve high die yields when semiconductor wafers are fabricated for a qualification process, a period of extensive testing to demonstrate the functionality of integrated circuits under various conditions. It is also crucial to maintain low defect levels for production wafers, which generally consist of qualified products that are shipped to customers. Variations from an expected range of defects are generally referred to as "excursions." Yield-limiting defect excursions can typically be tied to a dirty process tool, an ineffective cleaning operation process, or an operation that is not achieving optimal results.

Figure 1:
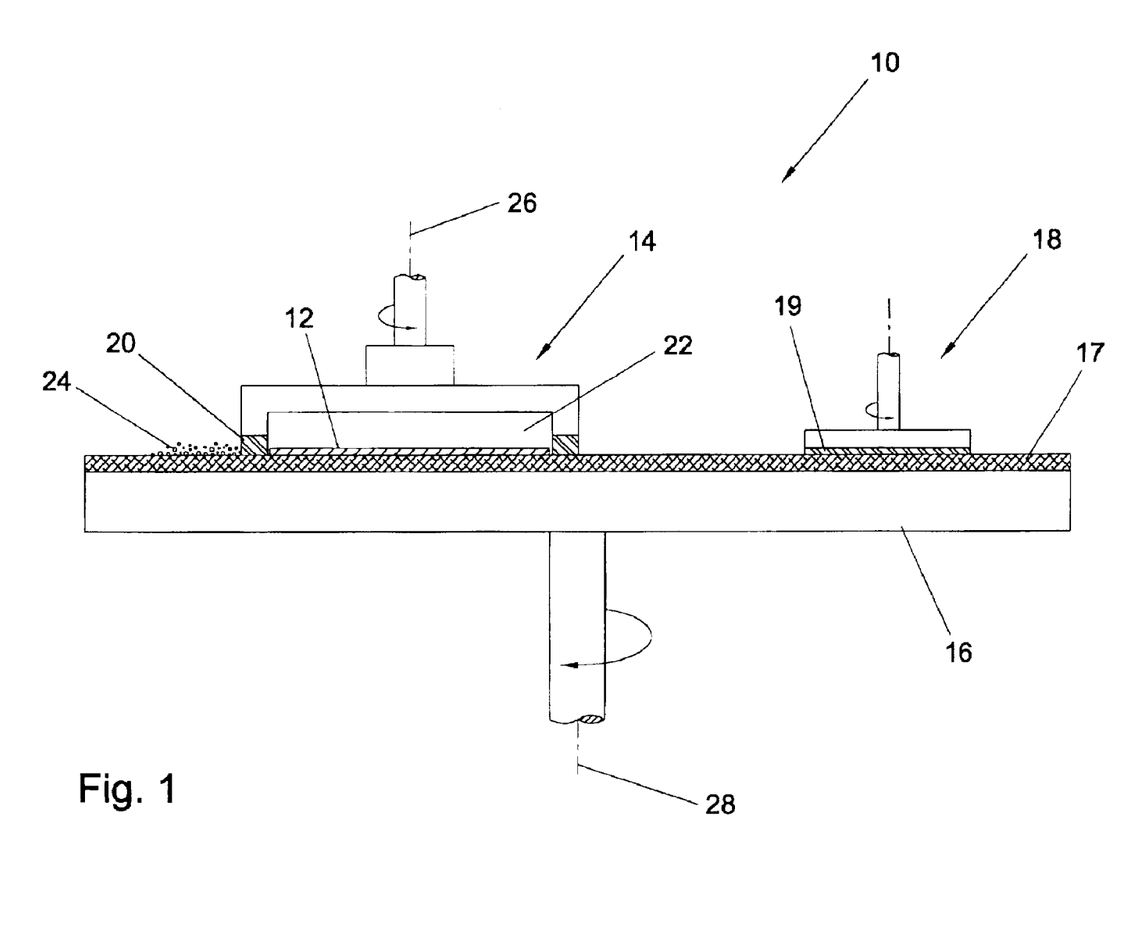
FIG. 1 is a sectional view of a conventional CMP apparatus during a wafer polishing operation.

FIG. 1 shows a side view of a typical simplified CMP apparatus 10 for polishing semiconductor wafers 12. CMP apparatus 10 comprises a wafer carrier, or polishing head 14, platen 16 supporting polishing pad 17, and pad conditioner 18 including conditioning disk 19. Polishing head 14 typically includes an annular retaining ring 20, a pocket 22 for housing a wafer 12, and a plurality of variable-pressure chambers (not shown) for exerting either suction or pressure onto the wafer backside, as well as other internal components.

Conditioning disk 19 is typically a substantially circular pad having an abrasive surface that contacts and moves over wafer polishing pad 17 in a predetermined pattern during wafer polishing. Pad conditioning helps to maintain optimal surface roughness and porosity of polishing pad 17, ensuring proper transport of slurry 24 to the surface of wafer 12 as well as the removal of CMP residue. Proper pad conditioning provides for a stable oxide removal rate and CMP process performance. CMP apparatus 10 generally includes a controller (not shown) that allows a variable down force to be applied to head 14, allows a variable and independent rotation of the head and platen 16, and the application of slurry 24 and/or other materials to polishing pad 17.

During operation, a pre-selected down force is preferably applied by head 14 to wafer 12 to achieve a desired polish pressure. Also during operation, head 14 is preferably rotated about spindle axis 26 at a desired rate while platen 16 is preferably rotated around platen axis 28 in an opposing direction at a desired rate. Preferably, abrasive slurry 24 having a pH between about 3 and about 11 and comprised of slurry particles having an average diameter of between about 20 and about 200 nanometers (nm) is present during polishing. More preferably, the slurry particles are comprised of silica ($SiO_2$) or alumina ($Al_2O_3$), depending on the surface to be polished. The action of the downforce of head 14, the respective rotations of head 14 and platen 16, and the chemical and mechanical effects of slurry 24 combine to polish the surface of wafer 12 to a desired planarity and height.

In more detail, in a typical CMP process, wafer 12 is held inside pocket 22 with upward suction applied to its back surface so as to keep the wafer raised above the lower face of retaining ring 20. A spindle motor (not shown) then begins rotating head 14 around spindle axis 26. Meanwhile, polishing head 14 is lowered, retaining ring 20 is pressed onto pad 17, and retaining ring 20 is polished by pad 17, with wafer 12 recessed, just long enough for head 14 to get up to polishing speed.

When head 14 reaches wafer polishing speed, typically about three seconds later, pressure is applied to the backside of wafer 12, lowering the wafer facedown to contact the surface of polishing pad 17, so that the wafer is substantially flush with and constrained outwardly by retaining ring 20. Retaining ring 20 and wafer 12 continue to spin relative to pad 17, which is rotating along with platen 16 in the opposite direction.

Figure 2:
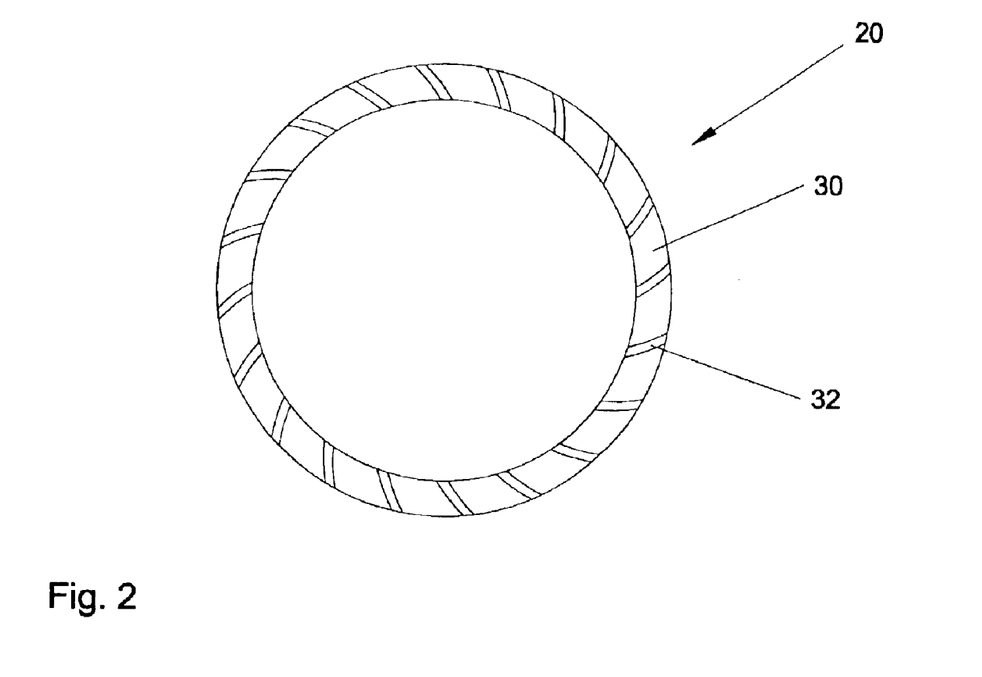
FIG. 2 is a bottom view of a conventional CMP retaining ring.

Referring now to FIG. 2, as shown in a bottom view, retaining ring 20 includes a typically polyphenylene sulfide surface 30 having a plurality of radial grooves 32. A typically silica or alumina slurry 24 is deposited onto pad 17 and flows through grooves 32, where it performs its polishing function between wafer 12 and pad 17. Since both wafer 12 and retaining ring 20 are contacting pad 17 during polishing, retaining ring surface 30 is gradually ground down after repeated use, so that the height of grooves 32 are shortened concurrently. As wafer 12 and retaining ring 20 are being polished against pad 17, miniscule particles from the wafer, ring and pad material are shed, mixing with slurry 24.

After CMP, head 14 and wafer 12 are lifted, and pad 17 is generally subjected to a high-pressure spray of deionized (DI) water to remove slurry residue and other particulate matter from the pad. Other particulate matter may include wafer residue, CMP slurry, oxides, organic contaminants, mobile ions and metallic impurities. Wafer 12 is then subjected to a post-CMP cleaning process, wherein a batch of wafers is immersed into a plurality of tanks containing a variety of cleaning solutions.

Even after conventional post-CMP cleaning, wafer backsides may be heavily contaminated, since current post-CMP clean methods do not adequately address wafer backside cleaning needs. Backside contamination largely includes CMP slurry residue, but may also include oxides, organic contaminants, mobile ions and metallic impurities. Particulate contaminants can be problematic beyond an individual wafer. A contaminated wafer can transfer particulate contamination to the next process tool, causing cross-contamination issues between tools and wafers, as well as adjacent wafers, as successive wafers pass through the fabrication process. Consequently, it is preferable to develop a method for removing metal and non-metal particles from wafer backsides.

Slurry particles typically exhibit a bond to a wafer backside during post-CMP cleans that appears to be stronger than a physical bond, thereby making them somewhat difficult to remove by physical force alone. An effective way to remove slurry residue is to implement a chemistry which "undercuts" slurry particles, microscopically etching away a small amount of silicon under the slurry particles, which frees them to be removed by mechanical means. Hydrofluoric acid (HF) can be used to undercut slurry particles on a wafer backside, as the HF will etch into the silicon around particles, making it easier for them to be removed.

In one preferred embodiment of the present invention, wafers exit the CMP process and are then subjected to a wafer cleaning method wherein a cleaning chemistry preferably comprised of about 35.7 percent by volume of concentrated (approximately 69.5 percent by weight) nitric acid ($HNO_3$), about 14.3 percent by volume of concentrated (approximately 49 weight percent) hydrofluoric acid (HF), about 14.3 percent by volume of concentrated (approximately 80 percent by weight) phosphoric acid ($H_3PO_4$) and about 35.7 percent by volume of DI water is applied to the wafer surface to be cleaned. Viewed in terms of weight percentage, this preferred cleaning chemistry is approximately 28 weight percent $HNO_3$, 6 weight percent HF, 15 weight percent $H_3PO_4$, and 51 weight percent $H_2O$. As is known from prior art cleaning methods, nitric acid is known to attack metal contaminants by at least partially dissolving or dislodging copper particles in particular, with particles over 1 micron in diameter being more difficult to dissolve. Hydrofluoric acid is known to undercut slurry particles by etching away small amounts of silicon underlying the slurry particles, and may prove effective at removing non-slurry particles as well. Phosphoric acid is especially effective at attacking and removing alumina particles. Acetic acid ($HC_2H_3O_2$) may optionally be used in place of phosphoric acid, in the same percentages, to vary the viscosity of the solution.

Figure 3:
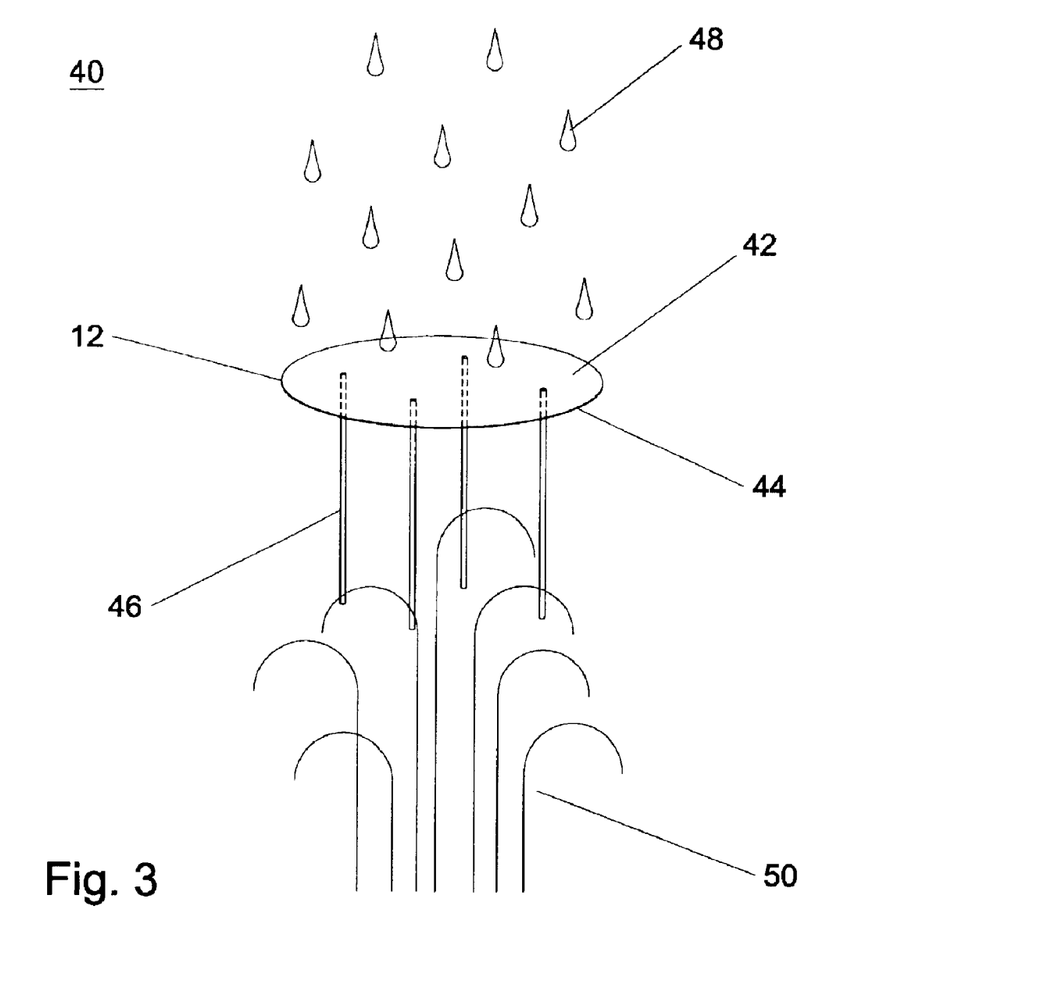
FIG. 3 is a side view of a semiconductor wafer undergoing backside particle removal in accordance with the preferred embodiments.

Preferably, the nitric-HF-phosphoric acid cleaning chemistry of the present invention is sprayed onto a wafer backside in a single-wafer process. As shown in FIG. 3, in the preferred embodiment, wafer 12 is oriented horizontally in chamber 40, with backside 42 facing up, and front side 44 facing down, resting on a plurality of pins 46. Front surface 44 is protected by a spray 50 of nitrogen gas directed upwards at the wafer front. As cleaning chemistry 48 of the present invention is sprayed onto back surface 42 of wafer 12, the wafer is rotated on pins 46, allowing cleaning chemistry 48 to distribute fully and evenly over the backside of the wafer. Cleaning chemistry 48 is preferably dispensed to wafer 12 at a volume of between about 0.5 liter and about 2 liters per wafer, at a rate of about 1.0 liter per minute, and for a duration of between about 30 and about 120 seconds. However, it will be understood that depending on wafer size, spin rate, and level of contamination, these variables may be altered as needed to achieve desirable cleaning results.

The cleaning chemistry of the present invention may be used in any backside cleaning tool with means for dispensing the cleaning chemistry to the wafer backside, and preferably having megasonic cleaning capability. After subjecting a wafer to the cleaning chemistry of the present invention, the wafer is preferably loaded into a conventional single-wafer processing brush scrubber, where the undercut particles are swept from the wafer surface. A DI water rinse with megasonic assist cleaning removes most of the remaining particulate matter from the wafer back, but could optionally remove particles from the wafer front instead.

As integrated circuits grow in complexity and technology advances to the point where increasingly more metal layers can be aligned in progressively smaller die, it becomes crucial to deliver a wafer cleaning method that will adequately remove particles from both the front and back sides of a wafer without adding undue operations to the fabrication process. Further, as there is generally one polishing step and a related post-CMP cleaning step for each metal layer on a wafer, as the number of metal layers increase, so do the number of associated processes.

In the interest of maintaining high fabrication throughput and profitability, it is desired to keep the number of operations, or steps, in the fabrication process as low as possible. Consequently, a wafer cleaning operation, such as the cleaning chemistry of the present invention, that can be implemented in the space of an existing conventional operation is desired. The cleaning chemistry of the present invention allows removal or copper contamination and CMP slurry in a single step utilizing existing fab toolsets and existing operations. Reduction of metal and non-metal particles will facilitate a reduction in yield issues, including depth of focus variations, critical dimension errors, hotspots, and cross-contamination.

When compared to a control wafer subjected to a conventional post-CMP clean after exiting the CMP operation, the cleaning chemistry of the present invention shows distinct improvements in particle removal. A conventional post-CMP cleaning method utilizing brush scrubbing with megasonic assist cleaning and a DI water rinse showed about a 9 percent removal of wafer particles larger than 0.2 microns. When subjected to a wafer clean with the cleaning chemistry of the present invention followed by a DI rinse, wafer particles were reduced by about 39 percent. Even greater particle reduction is exhibited when a post-CMP wafer is first subjected to a wafer clean with the cleaning chemistry of the present invention followed by conventional brush scrubbing with megasonic assist cleaning and a DI water rinse. In this case, the wafer experienced about a 94 percent reduction in particulate contamination. Even greater particle reduction is expected should megasonic assist cleaning also be used during the application of the cleaning chemistry of the present invention, then followed by mechanical cleaning, such as brush scrubbing with additional megasonic assist cleaning and a DI water rinse.

It will be understood that, although the cleaning chemistry of the present invention is preferably sprayed or "spun" on, it may be applied to the wafer in a variety of fashions, including brush application, bath soaking, or any other manner which allows the chemistry to fully contact all wafer surfaces to be cleaned. In the preferred embodiment of the present invention, the cleaning chemistry comprises nitric acid, hydrofluoric acid, phosphoric acid and DI water. It will be understood that while the cleaning chemistry of the present invention is most applicable as a post-CMP cleaning method, it may be employed at any step of fabrication where removal of metal or non-metal particles is needed.

Scratch defects are particularly troublesome, as grooves or notches on wafer surfaces may trap particles, making post-CMP cleans less effective and potentially causing local planarity issues in subsequent photolithography steps. Conventional brush scrubbing is generally a unidirectional cleaning method, so that when wafers pass under the scrub brush, particles are swept away in one direction only. Because of this, the brush scrubbing method alone is inherently deficient at removing many particles trapped in miniscule scratches present on the wafer surface, since some of the grooved particles might have to be subjected to force in a direction other than that of the brush in order to be dislodged.

Even marginal improvements in defect reduction can pay dividends, since each integrated circuit rendered defective reduces profitability. With some high-volume wafer fabrication plants starting dozens of thousands of wafers per week, slight yield improvements may produce a wealth of additional good die. Efficiency and high production volumes are paramount to the success of wafer fabrication, so it is generally advantageous to perform process improvements with minimum disruption to an established process flow. The cleaning chemistry of the present invention affords the improvement of defect reduction within a pre-existing post-CMP cleaning apparatus, and would require a relatively simple recipe change on any existing tool with means for dispensing the cleaning chemistry to the wafer backside for implementation.

While the preferred embodiments of the present invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention.

Accordingly, the scope of protection is not limited by the description set out above, but is only limited by the claims which follow, that scope including all equivalents of the subject matter of the claims. Each and every claim is incorporated into the specification as an embodiment of the present invention. Thus the claims are a further description and are an addition to the preferred embodiments of the present invention. Use of the term "optional" with respect to any element of a claim is intended to mean that the subject element is required, or alternatively, is not required. Both alternatives are intended to be within the scope of the claim.

The discussion of a reference in the Description of Related Art, if any, is not an admission that it is prior art to the present invention, especially any reference that may have a publication date after the priority date of this application. The disclosures of all patents, patent applications and publications cited herein are hereby incorporated herein by reference, to the extent that they provide exemplary, procedural or other details supplementary to those set forth herein.

What is claimed is:

1. A method for removing particulate defects from a semiconductor wafer backside comprising the steps of applying an aqueous cleaning solution consisting essentially of 10 to about 40 weight percent of nitric acid ($HNO_3$), 2 to about 15 weight percent of hydrofluoric acid (HF), and 5 to about 20 weight percent of phosphoric acid ($H_3PO_4$ to the semiconductor wafer backside wherein the particulate defects are metal particles and slurry particles comprising silica or alumina.

2. The method of claim 1 wherein the aqueous cleaning solution is spun onto the semiconductor wafer backside.

3. The method of claim 1 wherein the aqueous cleaning solution is sprayed onto the semiconductor wafer backside.

4. The method of claim 1 further comprising the step of applying an aqueous rinsing liquid to remove at least a portion of the aqueous cleaning solution from the semiconductor wafer backside.

5. The method of claim 4 further comprising a brush scrub cleaning following the step of applying the aqueous rinsing liquid.

6. The method of claim 5 wherein the brush scrub cleaning is followed by a water rinse.

7. The method of claim 4 further comprising the step of applying megasonic energy to the aqueous rinsing liquid.

8. The method of claim 7 further comprising the step of applying megasonic energy to the aqueous cleaning solution.

9. The method of claim 1 wherein the application of the aqueous cleaning solution occurs during a post-CMP cleaning process.

10. The method of claim 9 wherein the aqueous cleaning isolution is rinsed over the semiconductor wafer backside.

11. The method of claim 9 wherein the aqueous cleaning solution is spun onto the semiconductor wafer backside.

12. The method of claim 9 wherein the aqueous cleaning solution is sprayed onto the semiconductor wafer backside.

13. The method of claim 9 further comprising the step of applying an aqueous rinsing liquid to remove at least a portion of the aqueous cleaning solution from the semiconductor wafer backside.

14. The method of claim 13 further comprising a brush scrub cleaning following the application of the aqueous rinsing liquid.

15. The method of claim 14 wherein the brush scrub cleaning is followed by a water rinse.

16. The method of claim 13 further comprising the step of applying megasonic energy to the aqueous rinsing liquid.

17. The method of claim 16 further comprising the step of applying megasonic energy to the aqueous cleaning solution.

* * * * *